US007336133B2

(12) United States Patent
Shor

(10) Patent No.: US 7,336,133 B2
(45) Date of Patent: Feb. 26, 2008

(54) BUFFERED CASCODE CURRENT MIRROR

(75) Inventor: Joseph Shor, Tel Mond (IL)

(73) Assignee: Intel Corporation, Santa Clara, CA (US)

( * ) Notice: Subject to any disclaimer, the term of this patent is extended or adjusted under 35 U.S.C. 154(b) by 106 days.

(21) Appl. No.: 11/396,244

(22) Filed: Mar. 31, 2006

(65) Prior Publication Data

US 2007/0229166 A1 Oct. 4, 2007

(51) Int. Cl.
*H03F 3/04* (2006.01)

(52) U.S. Cl. .......................................... 330/288; 330/9

(58) Field of Classification Search ................ 330/288, 330/9, 285, 296
See application file for complete search history.

(56) References Cited

U.S. PATENT DOCUMENTS 4,311,967 A * 1/1982 Schade, Jr. ................. 330/288
6,011,415 A * 1/2000 Hahn et al. ................. 327/103
7,265,628 B2 * 9/2007 Lloyd et al. ................ 330/288

* cited by examiner

*Primary Examiner*—Henry Choe
(74) *Attorney, Agent, or Firm*—Schwegman, Lundberg & Woessner, P.A.

(57) ABSTRACT

An embodiment to mirror current having a pair of current mirroring transistors and a pair of cascode transistors coupled to the current mirror transistors, and furthermore having an amplifier to provide an offset voltage between the drain of a cascode transistor and the gate of a current mirror transistor, where the drain of the current mirror transistor is connected to the source of the cascode transistor, and where the amplifier buffers the gate of the current mirror transistor from the drain of the cascode transistor. Other embodiments are described and claimed.

34 Claims, 7 Drawing Sheets

BUFFERED CASCODE CURRENT MIRROR

FIELD

Embodiments relate to analog circuits, and more particularly, to current mirroring circuits.

BACKGROUND

A current mirror is a ubiquitous building block in many analog circuits, finding wide applications in such circuits as amplifiers, biasing circuits, analog-to-digital circuits, and digital-to-analog circuits, to name just a few. A drawback of using a standard current mirror in modern process technologies is that the transistors used in the current mirror have a relatively low output impedance. With low output impedance transistors, the current level in a standard current mirror changes as a function of drain voltage, which in general is undesirable. A known method of overcoming this is to utilize a cascode current mirror.

For a cascode current mirror to work properly, it is preferable that the various transistors forming the cascode current mirror are operating in their saturation region. However, in low voltage process technologies in which the transistor threshold voltage is on the order of 100 mV to 200 mV, one or more transistors in a cascode current mirror may easily go out of saturation, thereby limiting the desired current mirroring characteristics of the cascode current mirror.

It is desirable to provide current mirror structures with the relatively high output impedance of a standard cascode current mirror, but suitable for process technologies utilizing low threshold voltage transistors.

DESCRIPTION OF EMBODIMENTS

Figure 1:
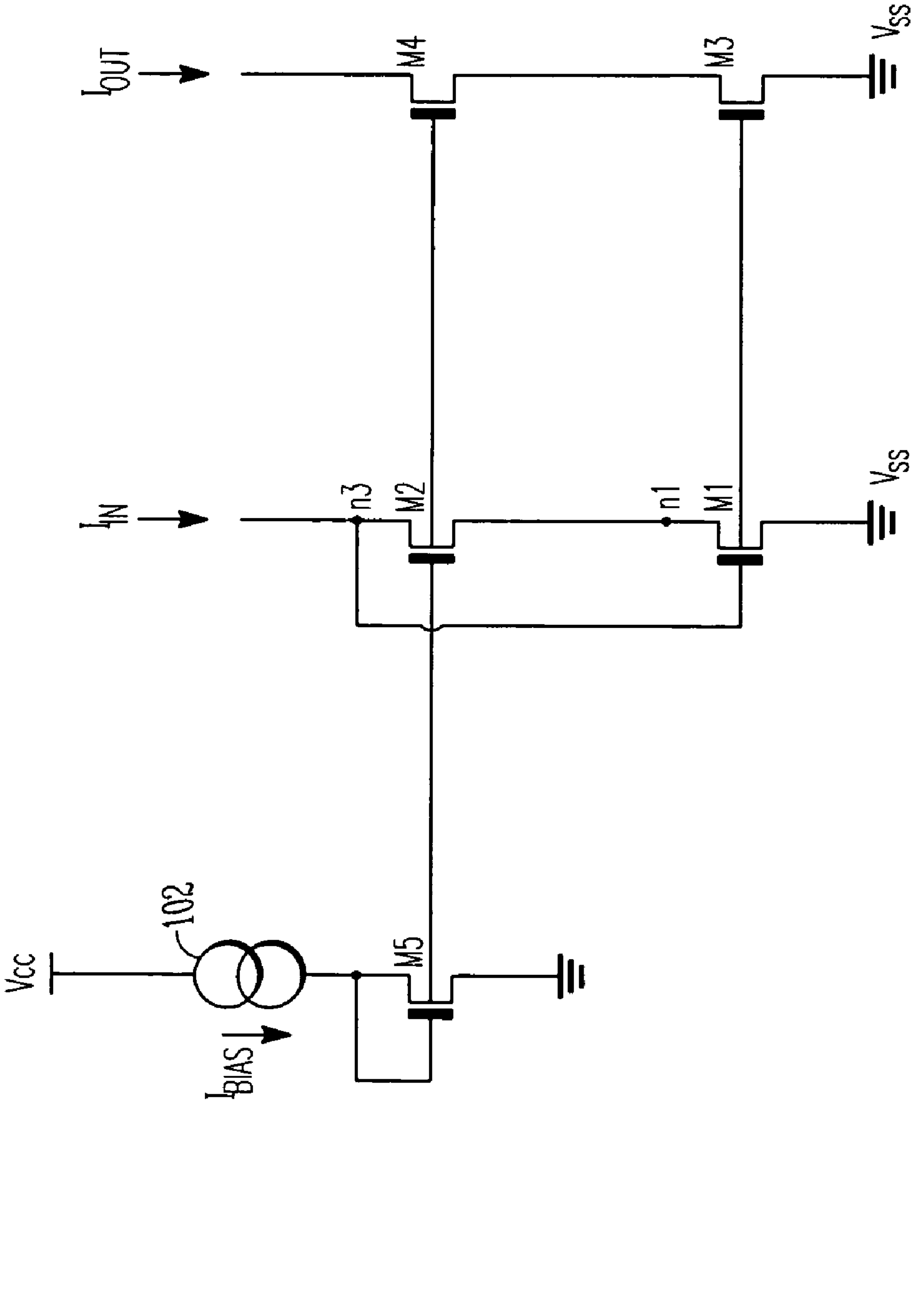
(PRIOR ART) FIG. 1
FIG. 1 is a prior art cascode current mirror.

Before describing embodiments of the present invention, it is useful to first consider a prior art cascode current mirror. There are several types of cascode current mirrors. A standard cascode structure is illustrated in FIG. 1. The circuit of FIG. 1 is sometimes referred to as a wide-swing cascode current mirror. An input current, denoted as $I_{IN}$, is mirrored to provide an output current, denoted as $I_{OUT}$. Current source 102 provides a bias current to transistor M5, so that the gate of transistor M5 provides a bias voltage to the gates of transistors M2 and M4.

With the cascode configuration of cascode transistor M4 connected to transistor M3, the small-signal output impedance looking into the drain of transistor M4 is approximately given by $g_m r_{ds3} r_{ds4}$, where $g_m$ is the transistor transconductance of transistor M4, $r_{ds4}$ is the small-signal source-drain impedance of transistor 4, and $r_{ds3}$ is the small-signal source-drain impedance of transistor M3.

The small-signal model for the configuration of transistor M2 connected to transistor M1 is essentially equivalent to a single diode-connected transistor, but the reason for including cascode transistor M2 is to lower the drain-source voltage of transistor M1 so that it is matched to the drain-sourced voltage of transistor M3. This matching makes the output current $I_{OUT}$ more accurately match the input current $I_{IN}$.

For proper operation, the transistors in FIG. 1 should operate in their saturation region. A saturation region is also referred to as an active region. A nMOSFET (Metal-Oxide-Semiconductor-Field-Effect-Transistor) operates in its saturation region provided $V_{DS}>V_{DS\text{-}sat}$, where $V_{DS}$ is the drain-to-source voltage and $V_{DS\text{-}sat}$ denotes the drain-source saturation voltage. The saturation voltage may be expressed as $V_{DS\text{-}sat}=V_{GS}-V_T$, where $V_{GS}$ is the gate-to-source voltage and $V_T$ is the threshold voltage, or by $V_{DS\text{-}sat}$=sqrt{1/k(W/L)}, where k is a process transconductance, W is a channel width, and L is a channel length. In many applications, it is preferable that $V_{DS}$ be approximately 100 mV greater than $V_{DS\text{-}sat}$.

Similar expressions for the saturation condition apply to a pMOSFET, but where the inequalities may be reversed because of algebraic sign conventions. For ease of discussion, we consider nMOSFETs in this description, although the description also applies to pMOSFET current mirrors provided the algebraic signs and inequalities are treated properly.

Referring to FIG. 1, denoting $V_3$ as the voltage at node n3, the drain of transistor M2, $V_3$ satisfies the relationship $V_3=V_T+V_{DS\text{-}sat}$(M1), where $V_{DS\text{-}sat}$(M1) is the saturation voltage of transistor M1. For simplicity, we assume all transistors have the same, or approximately the same, threshold voltage $V_T$. Transistor M1 should be in saturation if the voltage at node n1 (the drain of transistor M1), denoted as $V_1$, satisfies the inequality $V_1>V_{DS\text{-}sat}$(M1)+100 mV. (The voltage $V_1$ at node n1 is determined by the saturation voltage of transistor M5, which is a designed-for quantity.)

Suppose the previous inequality is barely met, so that we may write the equality $V_1=V_{DS\text{-}sat}$(M1)+100 mV. But, when $V_T$ is relatively low, such as in the range of 100 mV to 200 mV, this equality leaves little headroom for the drain-to-source voltage $V_{DS}$(M2) of transistor M2 because $V_{DS}$(M2) $=V_3-V_1=V_T-100$ mV. Because bias current may change with process and temperature variations, in light of this expression for $V_{DS}$(M2), transistor M2 may often go out of saturation, thereby limiting the usefulness of the cascode mirror of FIG. 1. (Note that $V_T$ may vary across process corners from about 200 mV to 400 mV, so using a stacked $V_T$ bias to help prevent transistor M2 from going out of saturation may not be practical for some applications because the higher range of possible $V_T$ values may limit the input or output voltage swings.)

Figure 2:
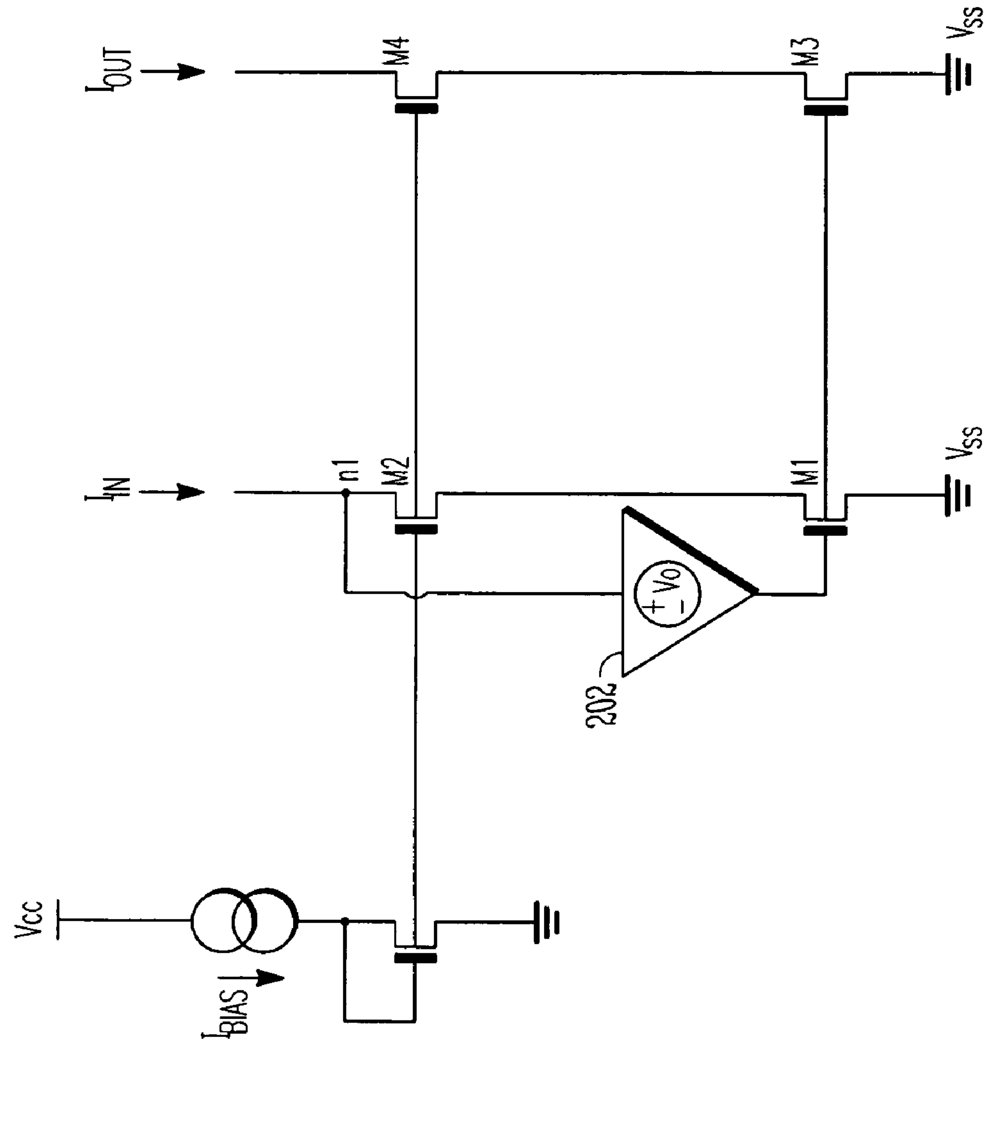
FIG. 2 illustrates an embodiment of the present invention.

It is expected that embodiments of the present invention provide current mirroring capability in which the transistors providing the current mirror function have a relatively low transistor threshold voltage. FIG. 2 provides a high-level circuit diagram of an embodiment. Module 202 represents a sub-circuit provides an offset voltage, represented symbolically by the voltage source Vo inside module 202, so that the voltage at node n1 (or the input port of module 202) is kept at a voltage Vo above the gate voltage of transistor M1 (or the output port of module 202). For some embodiments, the offset voltage Vo provided by module 202 may be approximately 200 mV, but other embodiments may provide other values for the offset voltage.

For some embodiments, Module 202 may also provide feedback from node n1 (the drain of transistor M2) to the gate of transistor M1 so that a rising voltage at node n1 causes a rising voltage at the gate of transistor M1, and a falling voltage at node n1 causes a falling voltage at the gate of transistor M1. That is, when viewing the input-output functional relationship provided by module 202, the output voltage of module 202 is an increasing function of its input voltage.

For some embodiments, Module 202 may also provide a buffering function such that it does not appreciably provide a load on node n1. That is, module 202 may present a relatively high impedance to node n1.

An instance of the embodiments represented by FIG. 2 may be termed a buffered cascode current mirror because the drain of cascode transistor M2 is buffered from the gates of the current mirror pair: transistors M1 and M3. By buffering the drain of transistor M2 from the gate of transistor M1, and by providing feedback with an offset voltage, module 202 allows the gate of transistor M1 to be raised to a level in which transistor M1 may sink current $I_{IN}$ and in which transistor M2 may remain in saturation. The value of the offset voltage Vo may be selected based on the amount of additional headroom that may be desired for transistor M2. The circuit in FIG. 2 functions as a current mirror because the input current, $I_{IN}$, is mirrored as the output current, $I_{OUT}$. The currents $I_{IN}$ and $I_{OUT}$ may be substantially equal to each other, or may be related to each other by a multiplicative scalar, as is well known.

Figure 3:
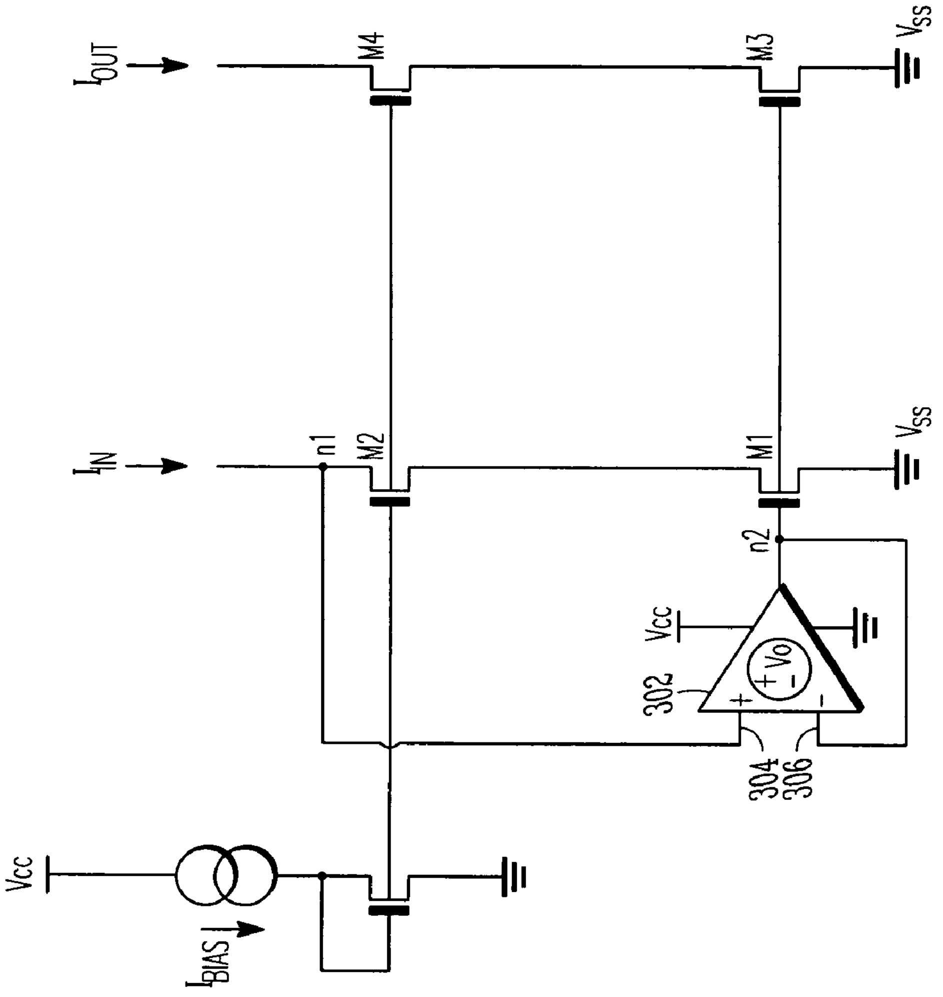
FIG. 3 illustrates another embodiment of the present invention.

Specific circuit implementations depend upon how module 202 is realized. As an example, an embodiment is shown in FIG. 3. Amplifier 302 has a built-in offset voltage of Vo, so that the voltage at positive input port 304 is Vo volts above the voltage at negative input port 306. For a high-gain amplifier, the voltage at node n1, the drain of transistor M2, is maintained at a voltage Vo above the voltage at node n2, the gate of transistor M1. For some embodiments, the offset voltage may be approximately 200 mV. With this offset voltage, it is expected that transistor M2 may be kept in saturation for many practical operating conditions.

Figure 4:
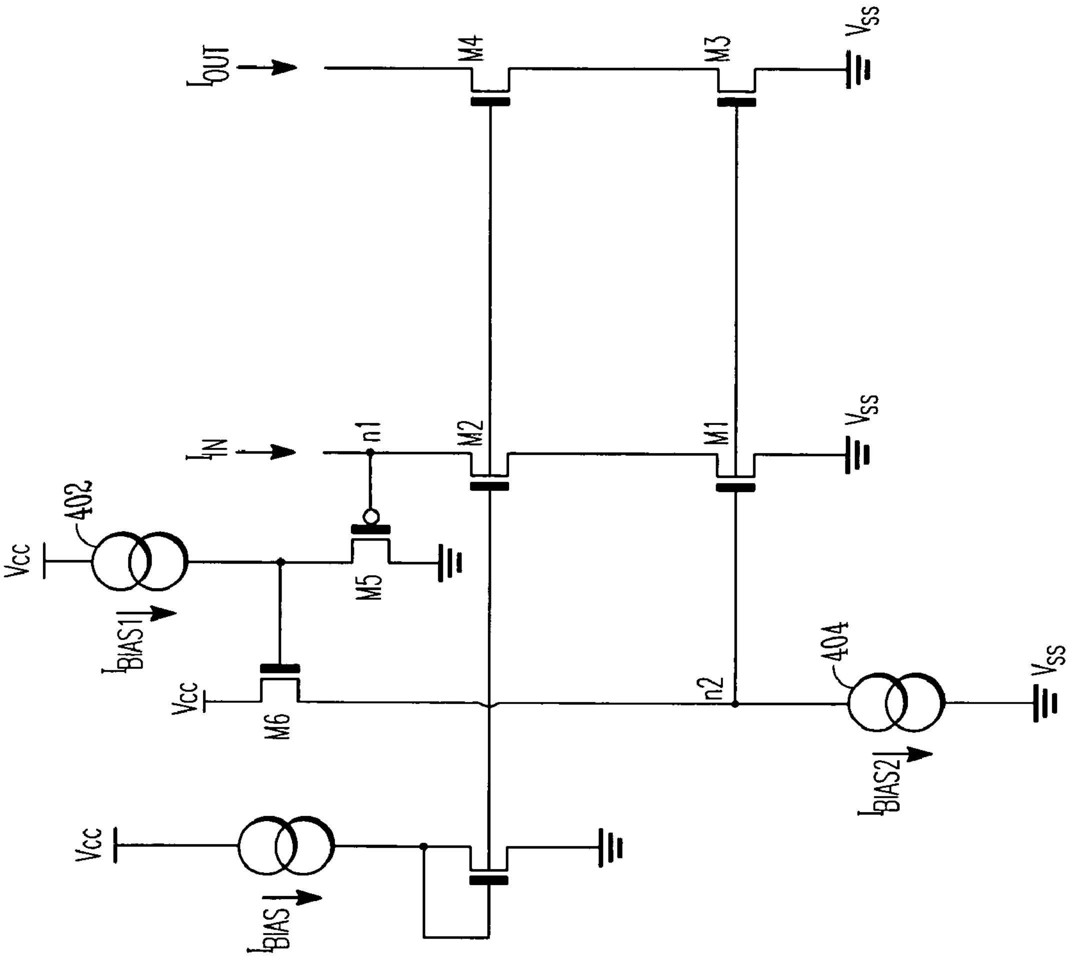
FIG. 4 illustrates yet another embodiment of the present invention.

Another embodiment is illustrated in FIG. 4. In the embodiment of FIG. 4, the offset voltage between node n1, the drain of transistor M2, and node n2, the gate of transistor M1, is generated by the back-to-back voltage level shifts provided by transistors M5 and M6. The source of pMOSFET M5 is biased by current source 402 supplying bias current $I_{BIAS1}$, and the source of nMOSFET M6 is biased by current source 404 supplying bias current $I_{BIAS2}$. Transistors M5 and M6 may be viewed as source-followers. The combination of these transistors, or each one of these transistors by itself, may be viewed as a voltage level shifter.

The voltage shift from the gate of pMOSFET M5 to its source is $|V_{GS}(\mathbf{5})|$, where $V_{GS}(\mathbf{5})$ is the gate-to-source voltage of pMOSFET M5, and the voltage shift from the gate of nMOSFET M6 to its source is $V_{GS}(\mathbf{6})$, where $V_{GS}(\mathbf{6})$ is the gate-to-source voltage of nMOSFET M6. These gate-to-source voltages may be written as $V_{GS}(\mathbf{5})=V_T(\mathbf{5})+V_{DS\text{-}sat}(\mathbf{5})$ and $V_{GS}(\mathbf{6})=V_T(\mathbf{6})+V_{DS\text{-}sat}(\mathbf{6})$, where $V_{DS\text{-}sat}(\mathbf{5})$ and $V_{DS\text{-}sat}(\mathbf{6})$ are the saturation voltages, respectively, of transistors M5 and M6, and $V_T(\mathbf{5})$ and $V_T(\mathbf{6})$ are the threshold voltages, respectively, of transistors M5 and M6. The threshold voltages for a nMOSFET and a pMOSFET are reasonably correlated to each other, varying over several tens of mVs for different process conditions, while the saturation voltages is a controlled parameter and may be varied accurately over several hundreds of mVs. As a result, it is possible to generate a reasonably accurate offset voltage, such as for example an offset voltage of 200 mV, by making the saturation voltage $V_{DS\text{-}sat}(\mathbf{6})$ of transistor M6 larger than that of transistor M5. With a proper offset voltage, such as for example 200 mV, the voltage at node n1 is raised with respect to that of node n2, and all of the transistors are expected to be kept in saturation for many practical applications.

Figure 5:
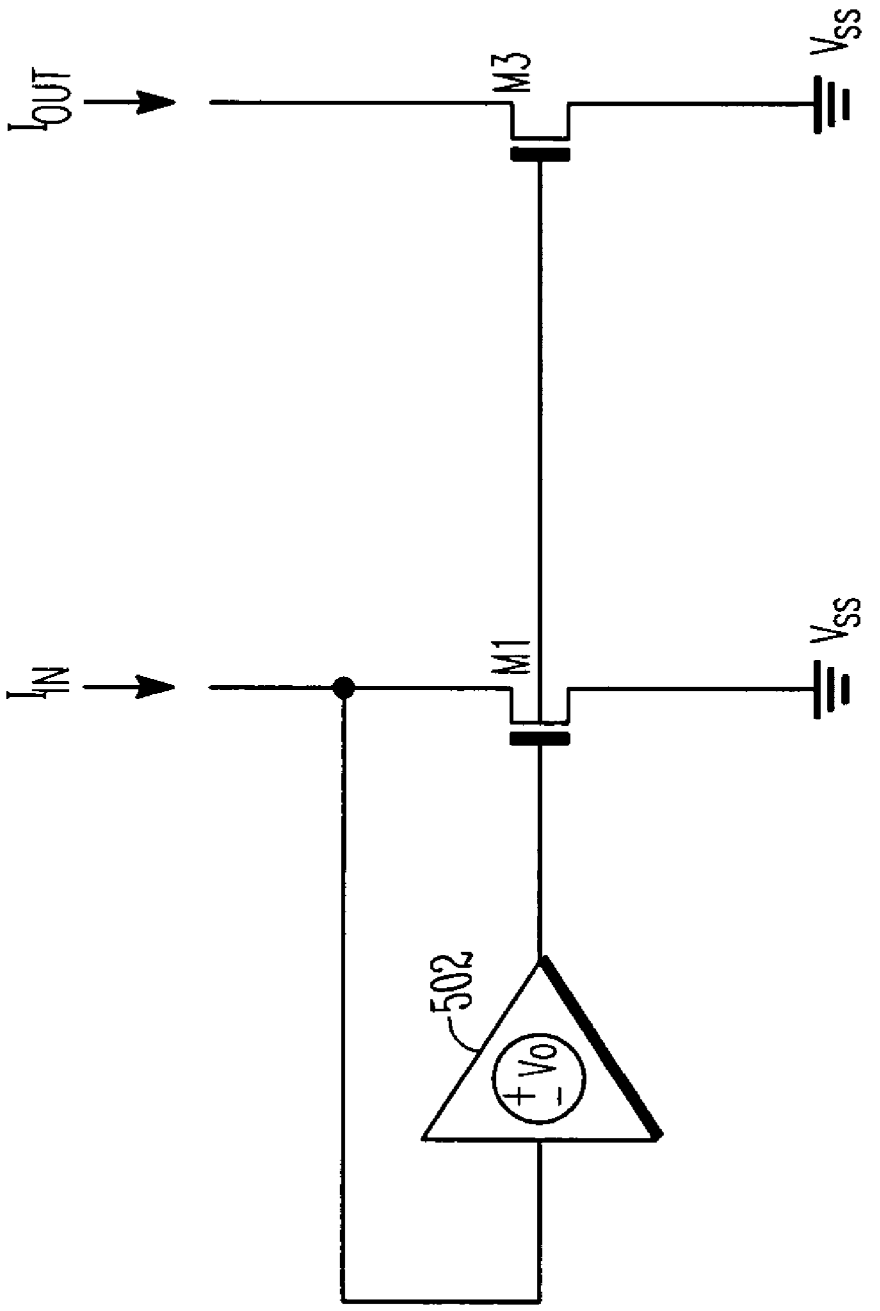
FIG. 5 illustrates yet another embodiment of the present invention.

Another embodiment is shown in FIG. 5. In this particular embodiment, cascode transistors are not utilized, and the circuit functions as a simple current mirror. For process technologies with a relatively very low threshold voltage $V_T$, such as for example where $V_T \leqq 0$, simple current mirrors may not be functional because the mirror transistor, which has its gate connected to its drain, will not be in saturation. In FIG. 5, module 502 is connected between the gate of transistor M1 and its drain so as to maintain an offset voltage $V_0$ between the drain and the gate of transistor M1. For some embodiments, this offset voltage may be in the range of 100 mV to 200 mV. The use of module 502 allows transistor M1 to be biased in the saturation region. The input current $I_{IN}$ is applied to the drain of transistor M1, and the output current $I_{OUT}$, which is substantially equal to or a multiple of the input current $I_{IN}$, is provided at the drain of transistor M3.

Figure 6:
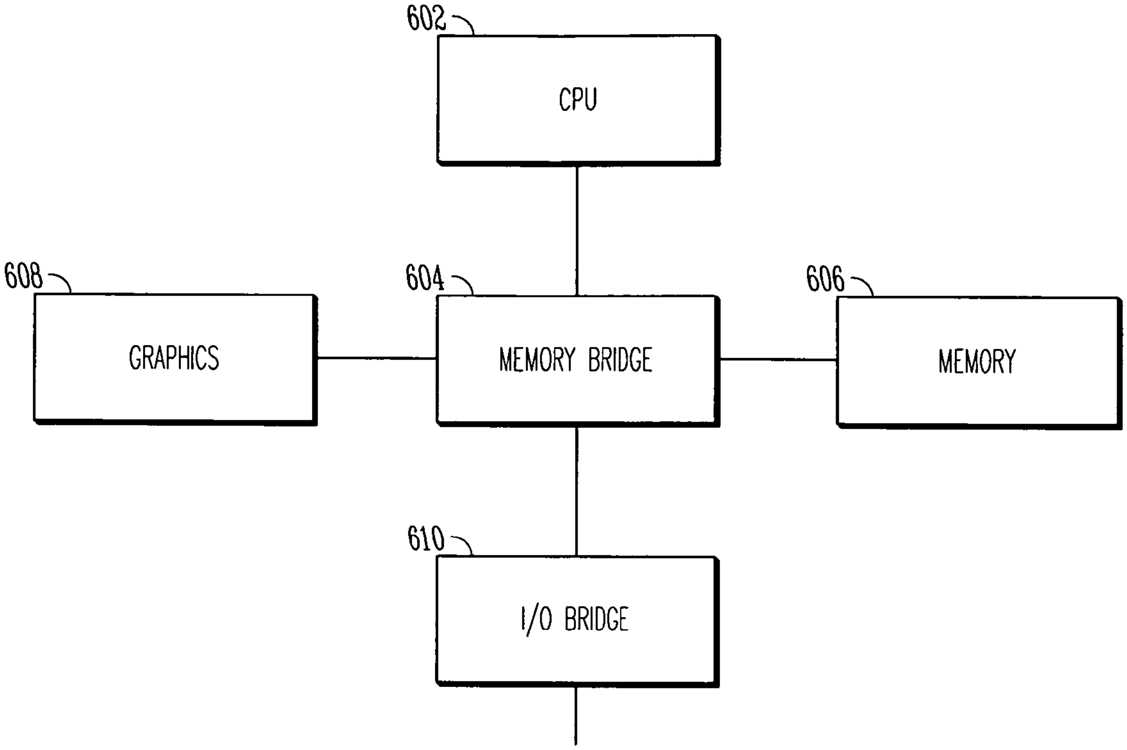
FIG. 6 illustrates a computer system employing an embodiment of the present invention.

Because current mirrors are ubiquitous building blocks in many circuits, it is expected that embodiments of the present invention may find wide applications to a large number of systems. One particular example is the computer system of FIG. 6, showing processor 602 in communication with memory bridge 604, which provides communication to system memory 606, graphics 608, and I/O (Input/Output) bridge 610. (For simplicity, not all modules in a computer system are necessarily shown in FIG. 6.) Various circuits in the components of FIG. 6 may utilize some or all of the embodiments described here. Such circuits may be, but are not limited to, band-gap voltage reference circuits, analog-to-digital and digital-to-analog converters, phase locked loops, RAMDACs (Random Access Memory Digital-to-Analog Converter), high speed input-output interfaces, and sensors, for example.

Figure 7:
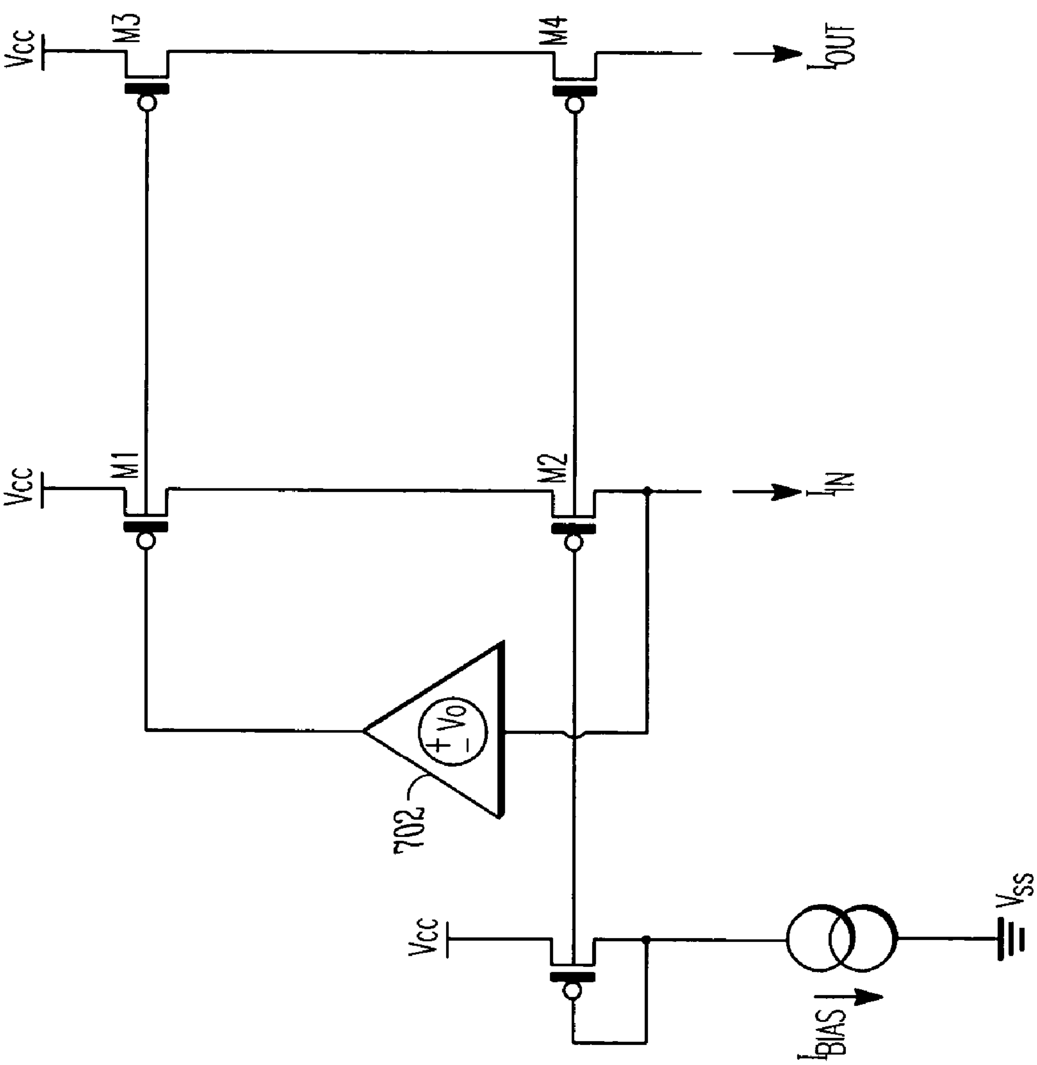
FIG. 7 is the dual to the circuit of FIG. 2.

Various modifications may be made to the disclosed embodiments without departing from the scope of the invention as claimed below. For example, duals to the described embodiments may be designed in which pMOSFETs replace nMOSFETs. As a particular example, the dual to the circuit of FIG. 2 is provided in FIG. 7. Amplifier 702 in FIG. 7 provides the same functional characteristics as amplifier 202 in FIG. 2, so that the gate of transistor M1 is kept at a voltage offset Vo above the drain of transistor M2.

Note that the disclosed current mirrors have their supply currents supplied by an appropriate supply rail. In the case of nMOS current mirrors, such as for the embodiments in FIGS. 1-4, the supply rail for the currents is denoted by the voltage Vss, which is connected to the sources of transistors M1 and M2. For pMOS current mirrors, such as for the embodiment of FIG. 7, the supply rail for the current is denoted by the voltage Vcc, which is connected to the sources of transistors M1 and M3.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, for example. In integrated circuit technology, the interconnect may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element which in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A circuit comprising:

a current mirror pair comprising a transistor, the current mirror pair transistor comprising a gate;

a cascode transistor comprising a drain; and a module to provide a voltage offset between the drain of the cascode transistor and the gate of the current mirror pair transistor.

2. The circuit as set forth in claim 1, wherein the current mirror pair transistor is a nMOSFET and the cascode transistor is a nMOSFET, wherein the drain of the cascode transistor is coupled to the module to have a higher voltage than the gate of the current mirror pair transistor.

3. The circuit as set forth in claim 1, the module comprising:

an operational amplifier comprising a positive input port connected to the drain of the current mirror transistor, a negative input port connected to the gate of the cascode transistor, and an output port connected to the gate of the cascode transistor to provide an offset voltage difference between the positive input port and the negative input port.

4. The circuit as set forth in claim 1, the module comprising:

at least one voltage level shifter coupled to the drain of the cascode transistor and coupled to the gate of the current mirror transistor.

5. The circuit as set forth in claim 4, the at least one voltage level shifter comprising:

a first transistor comprising a gate connected to the drain of the cascode transistor and comprising a source; and a second transistor comprising a gate connected to the source of the first transistor and comprising a source connected to the gate of the current mirror transistor.

6. A circuit comprising:

a first transistor comprising a gate and a drain;

a second transistor comprising a gate, a source connected to the drain of the first transistor, and a drain; and an amplifier comprising an input port connected to the drain of the second transistor and an output port connected to the gate of the first transistor to provide an offset voltage between the drain of the second transistor and the gate of the first transistor and to buffer the gate of the first transistor from the drain of the second transistor.

7. The circuit as set forth in claim 6, wherein the first and second transistors are nMOSFETs and the amplifier is connected to the first and second transistors to keep the drain of the second transistor at a higher voltage than the gate of the first transistor.

8. The circuit as set forth in claim 6, further comprising:

a third transistor comprising a gate connected to the gate of the first transistor, and comprising a drain; and a fourth transistor comprising a gate connected to the gate of the second transistor, and comprising a source connected to the drain of the third transistor.

9. The circuit as set forth in claim 8, the first transistor comprising a source and the second transistor comprising a source, the circuit further comprising a supply rail connected to the sources of the first and second transistors.

10. The circuit as set forth in claim 9, further comprising:

a bias transistor comprising a source connected to the supply rail, comprising a gate, and comprising a drain connected to the gate of the bias transistor and to the gate of the second transistor.

11. The circuit as set forth in claim 8, the second transistor comprising a drain and the fourth transistor comprising a drain, wherein an input current applied to the drain of the second transistor is mirrored as an output current at the drain of the fourth transistor.

12. The circuit as set forth in claim 6, the amplifier comprising:

an operational amplifier comprising a positive input port connected to the drain of the second transistor, a negative input port connected to the gate of the first transistor, and an output port connected to the gate of the first transistor to provide an offset voltage difference between the positive input port and the negative input port.

13. The circuit as set forth in claim 12, further comprising:

a third transistor comprising a gate connected to the gate of the first transistor, and comprising a drain; and a fourth transistor comprising a gate connected to the gate of the second transistor, and comprising a source connected to the drain of the third transistor.

14. The circuit as set forth in claim 10, the first transistor comprising a source and the second transistor comprising a source, the circuit further comprising a supply rail connected to the sources of the first and second transistors.

15. The circuit as set forth in claim 14, further comprising:

a bias transistor comprising a source connected to the supply rail, comprising a gate, and comprising a drain connected to the gate of the bias transistor and to the gate of the second transistor.

16. The circuit as set forth in claim 13, the second transistor comprising a drain and the fourth transistor comprising a drain, wherein an input current applied to the drain of the second transistor is mirrored at the drain of the fourth transistor.

17. The circuit as set forth in claim 6, the amplifier comprising:

at least one voltage level shifter coupled to the drain of the second transistor and coupled to the gate of the first transistor.

18. The circuit as set forth in claim 17, further comprising:

a third transistor comprising a gate connected to the gate of the first transistor, and comprising a drain; and a fourth transistor comprising a gate connected to the gate of the second transistor, and comprising a source connected to the drain of the third transistor.

19. The circuit as set forth in claim 18, the at least one voltage level shifter comprising:

a fifth transistor comprising a gate connected to the drain of the second transistor and comprising a source; and a sixth transistor comprising a gate connected to the source of the fifth transistor and comprising a source connected to the gate of the first transistor.

20. The circuit as set forth in claim 19, the first transistor comprising a source and the second transistor comprising a source, the circuit further comprising a supply rail connected to the sources of the first and second transistors.

21. The circuit as set forth in claim 20, further comprising:

a bias transistor comprising a source connected to the supply rail, comprising a gate, and comprising a drain connected to the gate of the bias transistor and to the gate of the second transistor.

22. The circuit as set forth in claim 19, the second transistor comprising a drain and the fourth transistor comprising a drain, wherein an input current applied to the drain of the second transistor is mirrored at the drain of the fourth transistor.

23. A computer system comprising:

a processor; and a memory bridge coupled to the processor; the memory bridge comprising:

a current mirror pair comprising a transistor, the current mirror pair transistor comprising a gate;

a cascode transistor comprising a drain; and a module to provide an offset voltage between the drain of the cascode transistor and the gate of the current mirror pair transistor.

24. The computer system as set forth in claim 23, wherein the current mirror pair transistor is a nMOSFET and the cascode transistor is a nMOSFET, wherein the drain of the cascode transistor is coupled to the module to have a higher voltage than the gate of the current mirror pair transistor.

25. The computer system a set forth in claim 23, the module comprising:

an operational amplifier comprising a positive input port connected to the drain of the current mirror transistor, a negative input port connected to the gate of the cascode transistor, and an output port connected to the gate of the cascode transistor to provide an offset voltage difference between the positive input port and the negative input port.

26. The computer system as set forth in claim 23, wherein the module comprises:

at least one voltage level shifter coupled to the drain of the cascode transistor and coupled to the gate of the current mirror transistor.

27. The computer system as set forth in claim 26, the at least one voltage level shifter comprising:

a first transistor comprising a gate connected to the drain of the cascode transistor and comprising a source; and a second transistor comprising a gate connected to the source of the first transistor and comprising a source connected to the gate of the current mirror transistor.

28. A circuit comprising:

a current mirror comprising a transistor, the transistor comprising a gate and a drain; and a module to provide an offset voltage between the drain of the transistor and the gate of the transistor.

29. The circuit as set forth in claim 28, the module comprising:

an amplifier comprising an input port connected to the drain of the transistor and an output port connected to the gate of the transistor to provide an offset voltage between the drain of the transistor and the gate of the first transistor.

30. The circuit as set forth in claim 29, the amplifier to buffer the gate of the transistor from the drain of the transistor.

31. The circuit as set forth in claim 28, further comprising a second transistor comprising a gate connected to the gate of the transistor.

32. The circuit as set forth in claim 31, the transistor comprising a source and the first transistor comprising a source, the circuit further comprising a supply rail connected to the sources of the first and second transistors.

33. The circuit as set forth in claim 32, the second transistor comprising a drain, wherein an input current applied to the drain of the transistor is mirrored as an output current at the drain of the first transistor.

34. The circuit as set forth in claim 33, wherein the transistor and the second transistor are nMOSFETs, and the supply rail is a negative supply rail.

* * * * *